United States Patent
Kim et al.

(10) Patent No.: US 10,224,212 B2
(45) Date of Patent: Mar. 5, 2019

(54) ISOTROPIC ETCHING OF FILM WITH ATOMIC LAYER CONTROL

(71) Applicant: Lam Research Corporation, Fremont, CA (US)

(72) Inventors: Yunsang Kim, Monte Sereno, CA (US); Hyuk-Jun Kwon, Daegu (KR); Dong Woo Paeng, Albany, CA (US); He Zhang, Chicago, IL (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/876,576

(22) Filed: Jan. 22, 2018

(65) Prior Publication Data

US 2018/0218915 A1    Aug. 2, 2018

Related U.S. Application Data

(60) Provisional application No. 62/612,845, filed on Jan. 2, 2018, provisional application No. 62/451,383, filed on Jan. 27, 2017.

(51) Int. Cl.
*H01L 21/3065* (2006.01)
*H01L 21/02* (2006.01)
*H01L 21/324* (2006.01)
*H01L 21/67* (2006.01)
*H01J 37/00* (2006.01)

(52) U.S. Cl.
CPC ......... *H01L 21/3065* (2013.01); *H01J 37/00* (2013.01); *H01L 21/02236* (2013.01); *H01L 21/324* (2013.01); *H01L 21/67069* (2013.01)

(58) Field of Classification Search
CPC .................................................. H01L 21/3065
USPC .......................................................... 438/694
See application file for complete search history.

(56) References Cited

U.S. PATENT DOCUMENTS

| | | | |
|---|---|---|---|
| 5,662,768 | A | 9/1997 | Rostoker |
| 5,869,405 | A | 2/1999 | Gonzalez et al. |
| 2011/0061812 | A1 | 3/2011 | Ganguly et al. |
| 2015/0132961 | A1 | 5/2015 | Chang et al. |
| 2016/0196969 | A1 | 7/2016 | Berry, III et al. |
| 2016/0196984 | A1 | 7/2016 | Lill et al. |

OTHER PUBLICATIONS

International Search Report and Written Opinion dated May 4, 2018 corresponding to International Application No. PCT/US2018/015046, 12 pages.

*Primary Examiner* — Roberts P Culbert (57) ABSTRACT

A method for isotropically etching film on a substrate with atomic layer control includes a) providing a substrate including a material selected from a group consisting of silicon (Si), germanium (Ge) and silicon germanium (SiGe). The method includes b) depositing a sacrificial layer on the material in a processing chamber by: cooling a lower portion of the substrate; one of creating or supplying an oxidant-containing plasma in the processing chamber; and increasing a surface temperature of the substrate for a predetermined period using rapid thermal heating while creating or supplying the oxidant-containing plasma in the processing chamber. The method includes c) purging the processing chamber. The method includes d) etching the sacrificial layer and the material by supplying an etch gas mixture and striking plasma in the processing chamber.

25 Claims, 5 Drawing Sheets

ISOTROPIC ETCHING OF FILM WITH ATOMIC LAYER CONTROL

CROSS-REFERENCE TO RELATED APPLICATIONS

This application claims the benefit of U.S. Provisional Application No. 62/612,845, filed on Jan. 2, 2018 and U.S. Provisional Application No. 62/451,383, filed on Jan. 27, 2017. The entire disclosures of the applications referenced above are incorporated herein by reference.

FIELD

The present disclosure relates to substrate processing systems, and more particularly systems and methods for performing selective isotropic etching of film with atomic layer control.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on substrates such as semiconductor wafers. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

To fabricate devices having small feature sizes such as those less than 7 nm, isotropic removal of material with nano scale control is required. Wet chemical etching causes structural damage due to pattern collapse. Dry chemical etching also causes structural damage. Atomic layer etch (ALE) provides limited isotropic removal due to ion directionality. All of these processes increase surface roughness of the underlying material that is to be etched.

SUMMARY

A method for isotropic etching of film on a substrate with atomic layer control includes a) providing a substrate including a film selected from a group consisting of silicon (Si), germanium (Ge) and silicon germanium (SiGe). The method includes b) depositing a sacrificial layer on the film in a processing chamber by: cooling a lower portion of the substrate; one of creating or supplying an oxidant-containing plasma in the processing chamber; and increasing a surface temperature of the substrate for a predetermined period using rapid thermal heating while creating or supplying the oxidant-containing plasma in the processing chamber. The method includes c) purging the processing chamber. The method includes d) etching the sacrificial layer and the film by supplying an etch gas mixture and striking plasma in the processing chamber.

In other features, the method includes cooling the lower portion of the substrate includes maintaining a predetermined temperature of a substrate support in a range from −80° C. to 20° C. during b). The rapid thermal heating increases the surface temperature of the substrate to a predetermined temperature in a range from 200° C. to 1000° C. The predetermined period is in a range from greater than zero to less than or equal to 20 milliseconds. The etch gas mixture includes a gas species selected from a group consisting of fluorine (F), chlorine (Cl) and bromine (Br).

In other features, the method includes controlling pressure in the processing chamber to a predetermined pressure in a range from less than 20 milliTorr to 1 Torr. The oxidant-containing plasma includes at least one gas species selected from a group consisting of molecular oxygen ($O_2$), molecular hydrogen ($H_2$), molecular nitrogen ($N_2$), and helium (He).

In other features, the method includes controlling pressure in the processing chamber to less than 1 microTorr. The oxidant-containing plasma includes a precursor gas selected from a group consisting of silane, germane, phosphane and diborane.

In other features, the oxidant-containing plasma is generated in the processing chamber by supplying an oxidant-containing gas mixture and supplying RF power to an inductive coil arranged around the processing chamber. The RF power is in a range from greater than 0 W to less than or equal to 1000 W at a predetermined frequency in a range from 2 to 14 MHz.

In other features, the method includes supplying RF bias power to the substrate support in a range from greater than 0 eV to 1000 eV during d). The method includes repeating b), c) and d) one or more times.

A method for isotropic etching a film on a substrate with atomic layer control includes a) providing a substrate including an exposed layer of germanium (Ge) in a processing chamber. The method includes b) one of creating or supplying plasma including a hydrogen gas species in the processing chamber for a first predetermined period. The method includes c) after the first predetermined period, exposing the substrate to a gas mixture including an oxygen gas species for a second predetermined period to create a oxide layer on the exposed layer. The oxide layer includes germanium monoxide (GeO) and germanium dioxide ($GeO_2$). The oxide layer includes more of the germanium monoxide (GeO) than the germanium dioxide ($GeO_2$). The method includes d) performing rapid thermal heating of a surface of the substrate during a third predetermined period to desorb the germanium monoxide (GeO) in the oxide layer thereby etching the exposed layer of germanium (Ge).

In other features, the substrate further includes an exposed layer of at least one of silicon (Si) and silicon dioxide ($SiO_2$) and wherein the etching the exposed layer of germanium (Ge) is selective to the exposed layer of germanium (Ge). The method includes repeating b), c) and d) one or more times.

In other features, the plasma in b) includes a hydrogen gas species selected from a group consisting of molecular hydrogen ($H_2$), diborane ($B_2H_6$), a hydrocarbon ($C_xH_y$) (where x and y are integers and y/x>2), ammonia ($NH_3$), and a gas including nitrogen and hydrogen ($N_xH_y$) (where x and y are integers and y/x>2).

In other features, the plasma in b) further includes an inert gas selected from a group consisting of molecular hydrogen ($H_2$), molecular nitrogen ($N_2$) and argon (Ar). The first predetermined period and the second predetermined period are in a range from 1 second to 120 seconds.

In other features, the method includes purging the processing chamber after b) and before c) and after c) and before d). The oxygen gas species in c) is selected from a group consisting of molecular oxygen ($O_2$), ozone ($O_3$), water ($H_2O$) and nitrous oxide ($N_2O$).

In other features, the method includes striking plasma during c). The rapid thermal heating in d) includes heating the surface of the substrate using at least one of a flash lamp and a laser. The third predetermined period is greater than zero and less than or equal to 1 second. The rapid thermal heating in d) heats the surface of the substrate during the third predetermined period to a temperature in a range from 400° C. to 800° C. The oxide layer includes greater than or equal to 90% germanium monoxide and less than or equal to 10% germanium dioxide. The method includes converting a native germanium dioxide (GeO2) layer on the exposed layer of germanium to germanium monoxide prior to b).

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure perform fast isotropic etching with atomic layer control using various approaches. In a first approach, a target layer of a substrate is oxidized using plasma and exposed to a pulsed heat source during the plasma oxidation. Etching is subsequently performed to remove the oxidation and about a monolayer of the target layer. The steps are repeated one or more times.

More specifically, the systems and methods described herein use oxidant-containing plasma to grow a thin sacrificial layer on the target layer. In some examples, the target layer includes silicon (Si), germanium (Ge), silicon germanium ($Si_aGe_b$) (where a and b are integers) (generically SiGe) or other material. In some examples, the thin sacrificial layer includes an oxide of the target layer. For example, when the target layer includes Si, the thin sacrificial layer includes silicon dioxide ($SiO_2$).

During exposure to the oxidizing plasma, a pulsed thermal heat source provides rapid thermal heating for a predetermined period. Due to the short duration, the heating is localized at a top surface of the substrate. In some examples, the pulsed thermal heat source includes at least one of a flash heat lamp, a laser or microwave source. The remaining (or lower) portions of the substrate are cooled by the substrate support to maintain a lower temperature. The rapid thermal heating at the top surface and cooling of the substrate allow the process to be performed without exceeding thermal budgets. Furthermore, the rapid heating by the pulsed thermal heat source is performed during a short period to avoid thermal stress and corresponding damage.

Subsequently, a plasma-based etch process is performed to remove the thin sacrificial layer and a highly-controlled portion of the target layer using a plasma-based etch process. In some examples, the two-step process removes a monolayer of the target layer during each cycle. In some examples, the plasma-based etch process uses a gas mixture including etch gas species selected from a group consisting of fluorine (F), chlorine (Cl) and/or bromine (Br). In some examples, the gas mixture further includes one or more other gases such as an inert gas. The two-step process is repeated as needed to isotropically etch back the target layer. The foregoing process performs isotropic etching with reduced surface roughness as compared to conventional methods.

In a second approach, isotropic etching of Ge with atomic layer control includes exposing the substrate to plasma including hydrogen species for a predetermined period prior to exposure to a gas including oxygen species (either with or without plasma). The plasma pretreatment and oxidation steps create a monolayer on the Ge including mostly GeO (and some $GeO_2$). The pretreatment step increases the amount of GeO (and reduces $GeO_2$) in the monolayer as compared to performing the oxidation step without hydrogen plasma treatment. The ratio of GeO to (GeO and $GeO_2$) is less than 0.4 without the plasma pretreatment step. When oxidized after the plasma pretreatment described herein, the ratio of GeO to (GeO and $GeO_2$) is increased to greater than 0.9. The higher ratio of GeO (which is more volatile than $GeO_2$) is more easily removed.

After exposing the substrate to a gas including oxygen species, rapid thermal heating of a surface of the substrate is performed to desorb a monolayer of the GeO. The Si is located under a $SiO_2$ passivating layer, which is not removed by the rapid heating source due to the higher boiling temperature of $SiO_2$.

GeO growth is self-limiting because the oxidation is performed at low temperatures and is limited to about one monolayer. As a result, Ge can be removed at the atomic thickness level. In some examples, about 0.6 nm of Ge is removed per cycle. Since only the top surface of the substrate is heated during very short intervals, the thermal budget can be very low and diffusion can be avoided.

In some examples, the systems and methods described herein are used to selectively etch layers of a Gate All Around (GAA) structure for a 3D transistor. By choosing the process conditions appropriately, selective etching of the target material may be performed relative one or more other exposed materials.

Figure 1:
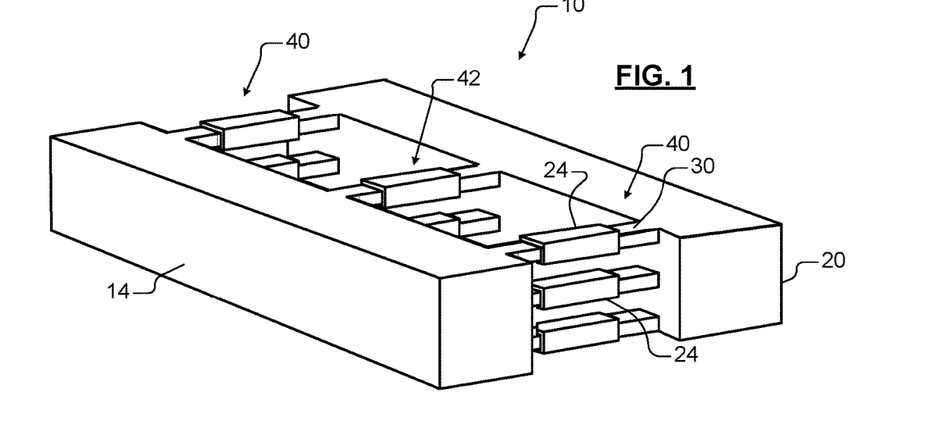
FIGS. 1-3 illustrate examples of a gate all around transistor that can be etched according to the present disclosure.
Figure 2:
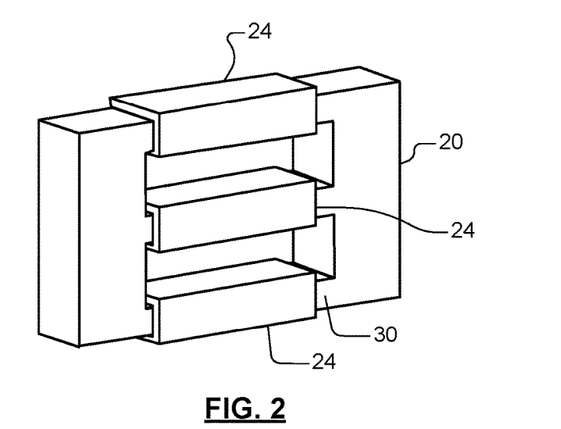
Figure 3:
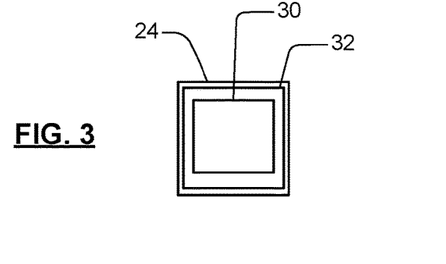

Referring now to FIGS. 1-3, the systems and methods may be used to etch gate-all-around (GAA) transistors 10, although the systems and methods may be used for other substrates. In FIGS. 1-2, the GAA transistors 10 include source and drain regions 14 and 20, respectively. Gate regions 24 are formed around channel regions 30 between the source region 14 and the drain region 20. The channel regions 30 may be formed using silicon (Si), germanium (Ge) or SiGe nanowires. In some examples, the systems and methods described herein are used to etch the nanowires. Some of the transistors may be PMOSFETs 40 and some of the transistors may be NMOSFETs 42. In FIG. 3, the channel regions 30 are surrounded by an oxide layer 32 and the gate regions 24.

Figure 4:
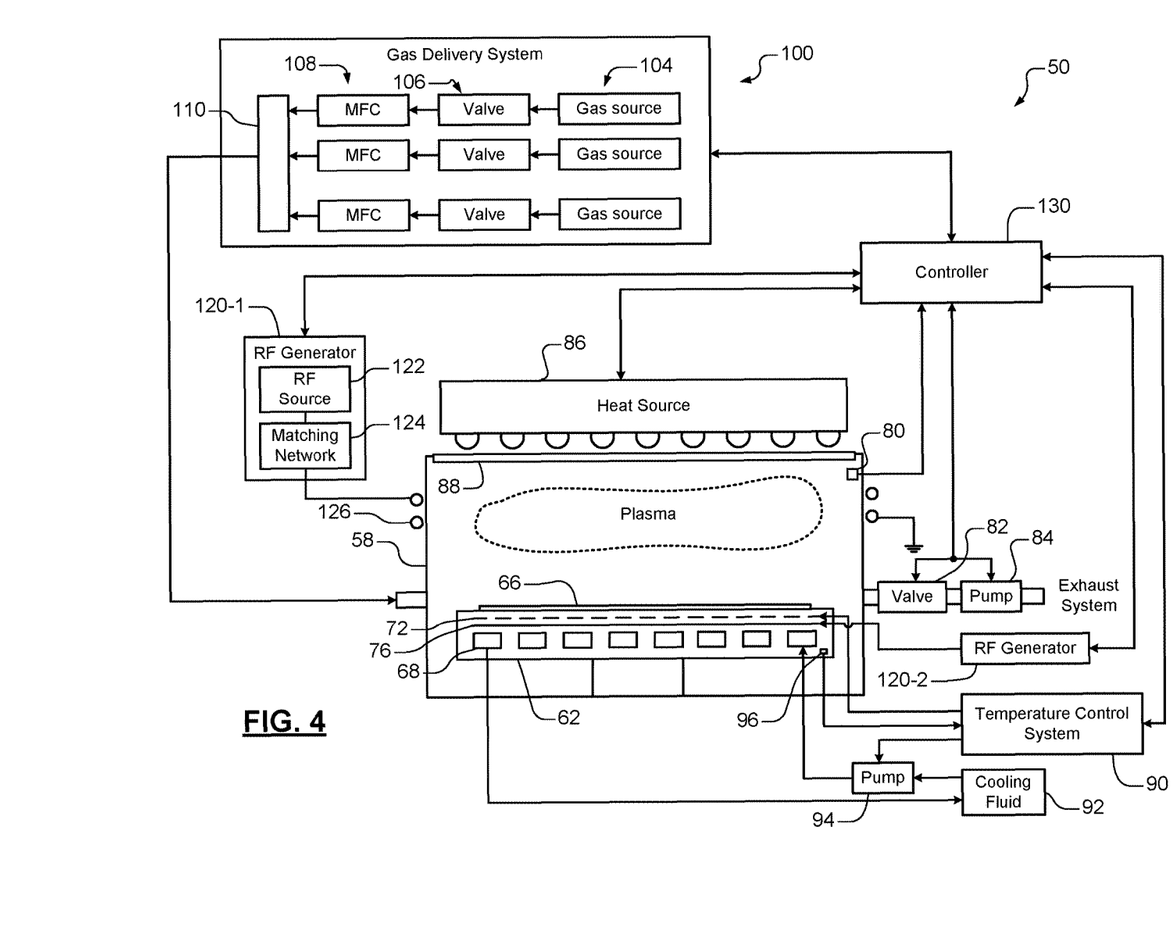
FIG. 4 is a functional block diagram of an example of a substrate processing system for performing isotropic etching according to the present disclosure.

Referring now to FIG. 4, a substrate processing system 50 is shown. While the substrate processing system includes an inductively coupled plasma (ICP) source, other plasma sources may be used. The substrate processing subsystem 50 includes a processing chamber 58 and a substrate support 62 for supporting a substrate 66. In some examples, the substrate support 62 includes an electrostatic chuck or vacuum chuck. In some examples, the substrate support 62 is temperature controlled. For example, the substrate support 62 may include a plurality of fluid channels 68 and heaters 72, which may be arranged in one or more zones. The substrate support 62 may further include an electrode 76.

One or more sensors 80 such as temperature and/or pressure sensors may be arranged in the processing chamber 58 to sense temperature and/or pressure, respectively. A valve 82 and pump 84 may be used to control pressure within the processing chamber 58 and/or to evacuate reactants from the processing chamber 58. In some examples, the pressure within the processing chamber 58 is maintained in a predetermined range between 20 mT and 10 T.

A heat source 86 provides a localized heat pulse to a top surface of the substrate 66 during a predetermined period in the presence of oxidizing plasma. The heat source 86 may be arranged outside of the processing chamber 58 adjacent to a window 88 such as a dielectric window. In some examples, the heat source 86 includes a flash lamp, a laser and/or a microwave lamp.

A temperature control system 90 may be used to control a temperature of the substrate support and the substrate 66. The temperature control system 90 may control supply of a cooling fluid from a fluid source 92 via a pump 94 that is connected to the fluid channels 68. In some examples, the fluid source 92 is maintained at a temperature less than or equal to 20° C., although other temperatures may be used. In some examples, the fluid source 92 is maintained at a temperature less than or equal to 0° C., although other temperatures may be used. In some examples, the fluid source 92 is maintained at a temperature less than or equal to −30° C., although other temperatures may be used. In some examples, the fluid source 92 is maintained at a temperature less than or equal to −60° C., although other temperatures may be used.

The temperature control system 90 may also control operation of the heaters 72. The temperature control system 90 may include one or more temperature sensors 96 to sense temperatures of one or more locations or zones of the substrate support 62.

A gas delivery system 100 includes one or more gas sources 104, one or more valves 106, one or more mass flow controllers 108 and a mixing manifold 110. The gas delivery system 100 supplies an oxidizing plasma gas mixture and an etching plasma gas mixture to the processing chamber 58 during oxidizing and etching portions of the process, respectively. In some examples, the oxidizing plasma gas mixture includes a precursor gas, molecular hydrogen ($H_2$), molecular oxygen ($O_2$), molecular nitrogen ($N_2$) and/or helium (He). In some examples, the pressure within the processing chamber 58 is maintained in a range between 20 mTorr and 10 Torr.

In other examples, the precursor gas includes silane ($SiH_4$), germane ($GeH_4$), phosphane ($PH_3$), and/or diborane ($B_2H_6$), although other precursor gases can be used. In some examples, the pressure within the processing chamber 58 may be maintained less than or equal to $10^{-6}$ Torr for these gases.

An RF generator 120-1 includes an RF source 122 and a matching network 124 that outputs RF power to a coil 126, which surrounds an outer wall of the processing chamber 58. The RF generator 120-1 creates a magnetic field in the processing chamber that strikes plasma. Another RF generator 120-2 may be used to supply an RF bias to the electrode 76 in the substrate support 62 during etching. A controller 130 communicates with the one or more sensors 80, the valve 82 and pump 84, the temperature control system 90, the heat source 86, the RF generators 120-1 and/or 120-2, and the gas delivery system 100 to control the process.

Figure 5:
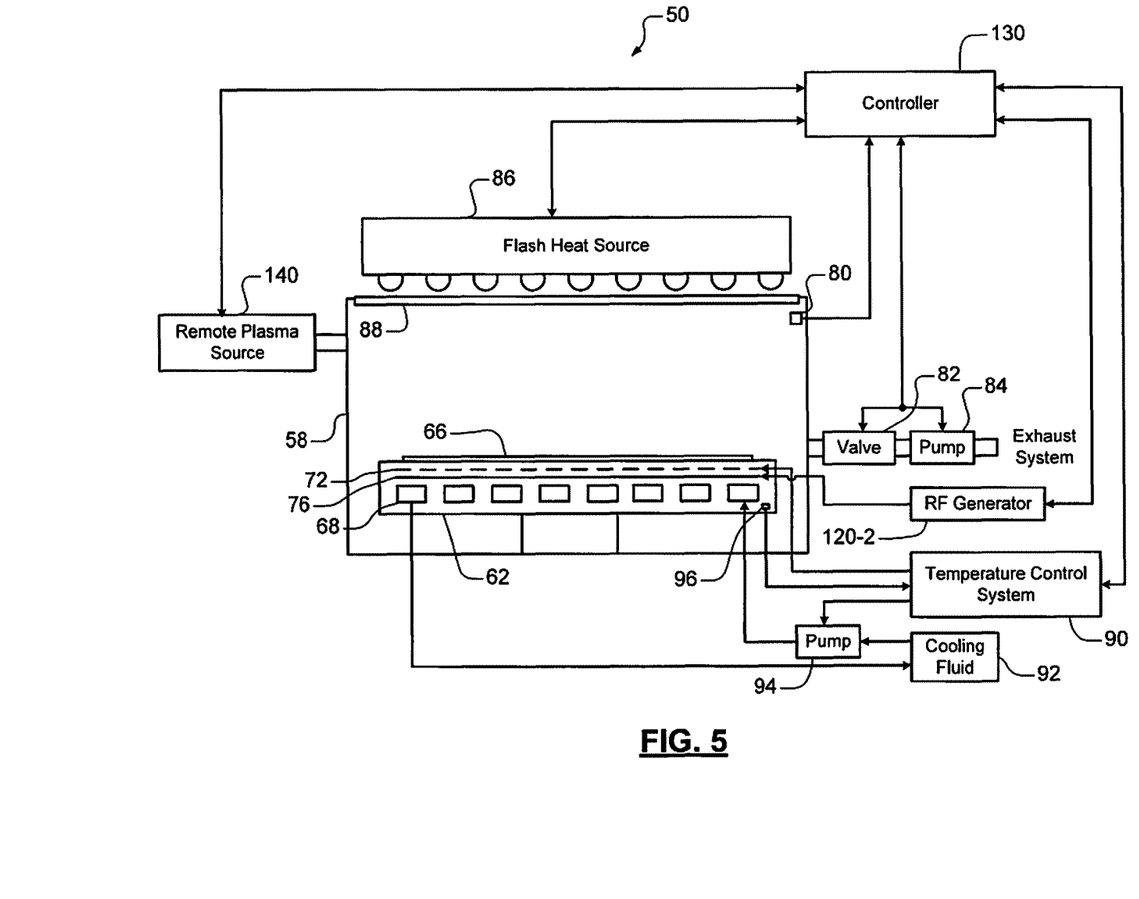
FIG. 5 is a functional block diagram of another example of a substrate processing system for performing isotropic etching according to the present disclosure.

Referring now to FIG. 5, the ICP source can be replaced by a remote plasma source 140 such as a microwave plasma source or other remote plasma source.

Figure 6:
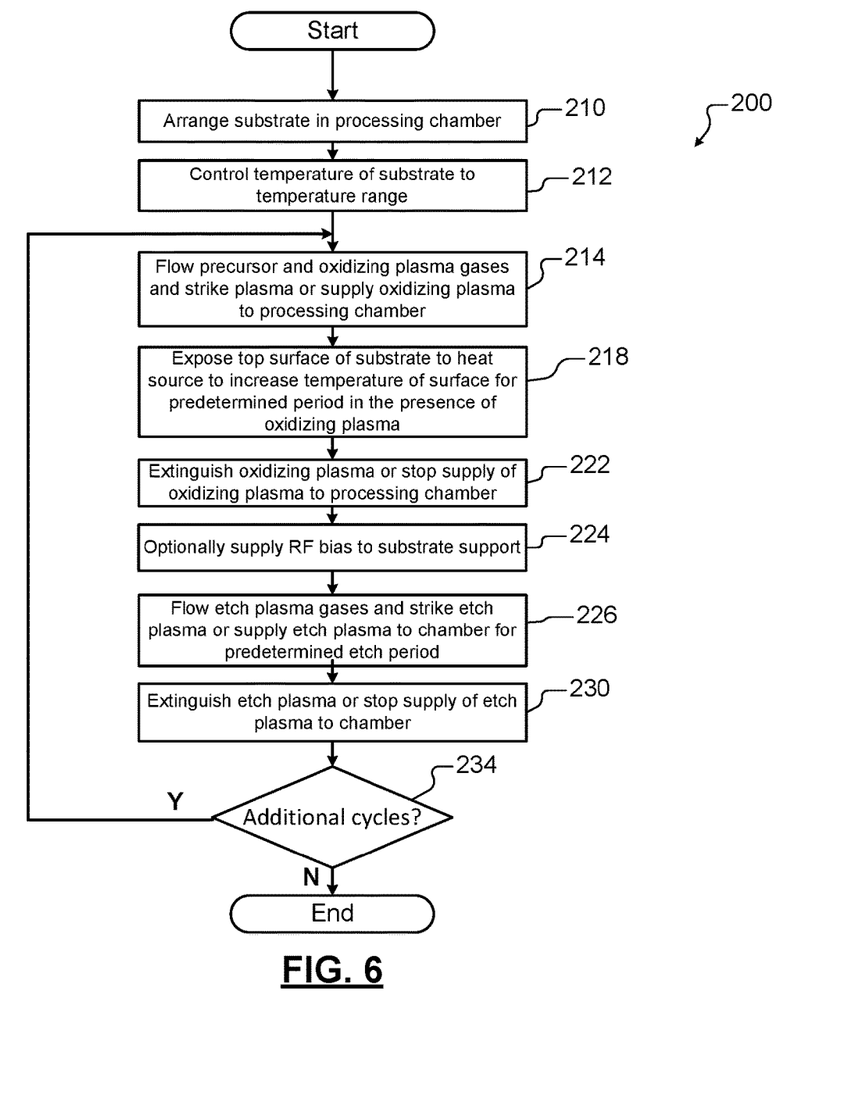
FIG. 6 is a flowchart illustrating an example of a method for performing isotropic etching according to the present disclosure.

Referring now to FIG. 6, a method 200 for etching film on a substrate according to the present disclosure is shown. At 210, a substrate is arranged in a processing chamber. At 212, a temperature of the substrate is controlled to a predetermined temperature in a predetermined temperature range. In some examples, the predetermined temperature range is from −80° C. to 20° C.

At 214, precursor and plasma gases are supplied to the processing chamber and oxidizing plasma is struck in the processing chamber. In some examples, when ICP is used, the RF power is supplied in a range from 0 to 3000 W at 2 to 14 MHz, although other power levels and frequencies can be used. Alternately, oxidizing plasma can be supplied to the processing chamber by a remote plasma source such as a microwave plasma source.

At 218, the substrate is exposed to a heat source to heat a top surface of the substrate for a predetermined period in the presence of the oxidizing plasma. In some examples, the top surface of the substrate is heated to a temperature in a predetermined temperature range. In some examples, the predetermined temperature range is from 200° C. to 1000° C. In some examples, the predetermined period is in a range from 0 to 20 ms. At 222, the plasma is extinguished or the supply of oxidizing plasma to the chamber is stopped. In some examples, the oxidizing plasma is maintained for a period between 1 and 5 seconds.

At 224, an RF bias is optionally supplied to the substrate support. In some examples, the RF bias power is in a range from 0 to 500 Watts and the RF bias is supplied in a range from 0 to 1000 eV. At 226, a plasma etch gas mixture is supplied to the processing chamber and etching plasma is struck in the processing chamber or etching plasma is supplied to the processing chamber from a remote plasma source for a predetermined etch period. At 230, the etching plasma is extinguished or the supply of etching plasma is stopped to the processing chamber. In some examples, the etch plasma is maintained for a period between 1 and 5 seconds. If additional cycles are required as determined at 234, the process returns to 214.

Figure 7:
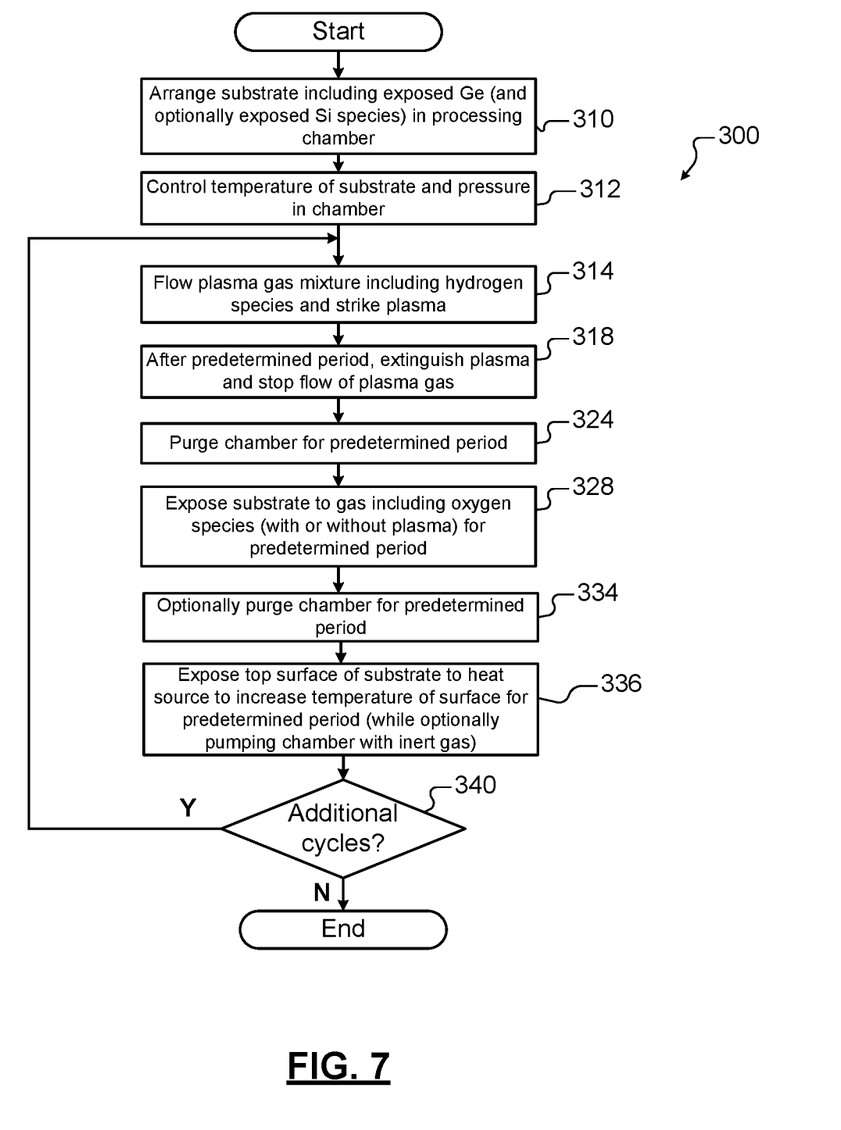
FIG. 7 is a flowchart illustrating an example of a method for performing selective etching of germanium according to the present disclosure.

Referring now to FIG. 7, a method for isotropically etching germanium (Ge) with atomic layer precision and with high selectivity to other exposed films including silicon (Si) species is shown. In some processes, it is desirable to remove Ge without removing film including silicon (Si) species (such as Si or $SiO_2$) or another material like Si. For example, selective etching of Ge relative to Si or $SiO_2$ may be performed when etching Ge nanowires.

Conventional methods for selectively etching Ge include dry etching and wet etching. Dry etching using plasma tends to cause surface roughness, which is undesirable. Wet etching processes tend to cause pattern damage such as pattern collapse. In other conventional processes, the Ge is oxidized (thermally or with ozone or an oxygen-containing plasma). The exposed Si is oxidized as well. The $GeO_2$ can be thermally desorbed selectively relative to the $SiO_2$. However, this removal process requires a very high temperature (generally 450° C. to 850° C.) that is usually not compatible with thermal budget requirements.

The method for isotropically etching Ge film on a substrate with atomic layer control according to the present disclosure includes exposing the substrate to plasma including hydrogen species for a predetermined period prior to exposure to a gas including oxygen species (either with or without plasma). The pretreatment and oxidation steps create a monolayer on the Ge including mostly GeO (and some $GeO_2$). The pretreatment step increases a ratio of GeO to (GeO and $GeO_2$) as compared to performing the oxidation step without hydrogen plasma treatment. The ratio of GeO to (GeO and $GeO_2$) is less than 0.4 without the pretreatment step. When oxidized after pretreatment described herein, the ratio of GeO to (GeO and $GeO_2$) is increased to greater than 0.9. The higher ratio of GeO (which is more volatile than $GeO_2$) is more easily removed.

After exposing the substrate to a gas including oxygen species, rapid thermal heating of a surface of the substrate is performed to desorb a monolayer of the GeO. The Si is located under a $SiO_2$ passivating layer and is not removed due to the higher boiling temperature of $SiO_2$.

In the method described herein, GeO growth is self-limiting because oxidation performed at low temperatures is limited to about one monolayer. As a result, Ge can be removed at the atomic thickness level. In some examples, about 0.6 nm of Ge is removed per cycle. Since only the top surface of the substrate is heated during very short intervals, the thermal budget can be very low and diffusion can be avoided.

Referring now to FIG. 7, a method 300 for etching germanium (Ge) selectively relative to film including silicon (Si) species is shown. At 310, a substrate including exposed Ge (and optionally exposed Si or $SiO_2$) is arranged in a processing chamber. At 312, a temperature of the substrate and pressure within the processing chamber are controlled to predetermined values (along with other process parameters as needed).

At 314, a gas mixture including hydrogen species is supplied to the processing chamber and plasma is struck in the processing chamber to treat exposed surfaces of the substrate. At 318, after a predetermined period, the plasma including hydrogen species is extinguished and the flow of plasma gas is stopped. At 324, the processing chamber is purged for a predetermined period with an inert gas. In some examples, the inert gas is selected from a group consisting of argon (Ar), molecular nitrogen ($N_2$) or helium (He).

At 328, the substrate is exposed to oxidizing gas including oxygen species for a predetermined period. In some examples, plasma is struck in the chamber during the oxidation step. In other examples, plasma is not used during the oxidation step. The oxidizing gas forms a monolayer including a high ratio of GeO to (GeO and $GeO_2$) due to the pretreatment step. In some examples, the ratio is greater than or equal to 90%.

At 334, the processing chamber is purged for a predetermined period. At 336, a top surface of the substrate is exposed to rapid thermal heating to increase a temperature of the surface of the substrate for a predetermined period. In some examples, the processing chamber is pumped with an inert gas during rapid thermal heating.

At 340, the method determines whether additional cycles are to be performed. If 340 is true, the method returns to 314 otherwise the method ends.

In some examples, the plasma gas including hydrogen species is selected from a group consisting of molecular hydrogen ($H_2$), diborane ($B_2H_6$), a hydrocarbon ($C_xH_y$) (where x and y are integers and y/x>2), and/or ammonia ($NH_3$) or other gases including nitrogen and hydrogen ($N_xH_y$) (where x and y are integers and y/x>2). In some examples, reducing organic compounds can be used. In some examples, a flow rate of the plasma gas to the processing chamber is in a range from 5 to 1000 standard cubic centimeters (sccm).

In some examples, the gas including hydrogen species is mixed with an inert gas such as He, Ar and/or $N_2$. In some examples, the hydrogen species comprises greater than 0% and less than or equal to 99% of the plasma gas mixture. In some examples, the substrate is exposed to plasma gas for a predetermined period in a range from 1 s to 120 seconds. In some examples, RF power is in a range from 5 W to 3000 W during hydrogen plasma treatment. In some examples, the chamber pressure is controlled in a pressure range from 1 mT to 20T during hydrogen plasma treatment. In some examples, the substrate temperature is maintained less than or equal to 50° C. during hydrogen plasma treatment.

In some examples, transformer coupled plasma (TCP) is used. In other examples, inductively coupled plasma (ICP) is used. In some examples, chamber pressure is maintained greater than or equal to 180 mT when plasma is struck during pretreatment. In some examples, the plasma with hydrogen species is supplied for a period in a range from 10 s to 60 s. In some examples, a plasma gas mixture including Ar and $H_2$ are supplied at a flow rate in a range from 90 to 500 sccm.

In some examples, the purge step includes supplying an inert gas to the chamber at a flowrate in a range from 5 to 1000 standard cubic centimeters (sccm). In some examples, the inert gas is selected from a group consisting of Ar, $N_2$ or He. In some examples, the processing chamber is purged for a predetermined period in a range from 1 s to 120 seconds. In some examples, the chamber pressure is controlled in a range from 1 mT to 20 T during purging. In some examples, the substrate temperature is maintained less than or equal to 50° C. during purging.

In some examples, the oxidation step includes supplying a gas mixture including oxygen species. Examples of gases including oxygen species include molecular oxygen ($O_2$), ozone ($O_3$), water ($H_2O$), and/or nitrous oxide ($N_2O$). In some examples, plasma is struck during the oxidation step. In some examples, plasma is not struck during the oxidation step.

In some examples, a flow rate of the oxidizing gas is in a range from 5 to 1000 standard cubic centimeters (sccm). In some examples, the substrate is exposed to oxidizing gas for a predetermined period in a range from 1 s to 120 seconds. In some examples, RF power is supplied in a range from 5 W to 3000 W. In some examples, the chamber pressure is controlled in a range from 1 mT to 20T during the oxidation step. In some examples, the substrate temperature is maintained less than or equal to 50° C. during the oxidation step.

In some examples, chamber pressure is maintained greater than or equal to 500 mT during the oxidation step, although other pressures can be used. Higher pressure can be used during the oxidation step to shorten an oxidation period. In some examples, the oxidation step is performed during a period in a range from 10 s to 60 s. In some examples, $O_2$ is supplied at a flow rate in a range from 150 to 500 sccm.

In some examples, the rapid thermal heating includes heating a surface of the substrate using at least one of a flash lamp or a laser. In some examples, a surface of the substrate is heated to a temperature in a range from 200° C. to 800° C. for a predetermined period. In some examples, when a flash lamp is used, the exposure period is in a range from 1 to 1000 milliseconds (ms). In some examples, when a laser is used, the exposure period is in a range from 1 femtoseconds to 1000 ms. In some examples, the chamber pressure is controlled in a range from 1 mT to 20T during rapid thermal heating. In some examples, the substrate temperature is maintained less than or equal to 50° C. during rapid thermal heating.

In some examples, a surface temperature of the substrate is temporarily increased to greater than or equal to a predetermined temperature in a temperature range from 400° C. to 800° C. (such as, for example, 400° C., 450° C., or 500° C.). In some examples, each rapid thermal heating step includes a single pulse or a group of pulses.

The method according to the present disclosure is capable of converting native oxides ($GeO_2$) to GeO. After the removal of $GeO_2$, a hydrogen-rich Ge surface is selectively converted to GeO, which is removed using rapid thermal heating. During the method described herein, GeO is grown on exposed Ge surfaces. Since Si does not keep growing $SiO_2$ at low temperature, the Si will be passivated with thin layer of $SiO_2$. Only Ge is removed since a boiling point of $SiO_2$ is greater than 2000° C. Since the thermal process is performed using inert gas and not oxidizing gas, oxidation does not occur during the rapid thermal heating.

For the native oxides, $GeO_2$ can be reduced by plasma including hydrogen species to GeO. After the first cycle removes the $GeO_2$, the H-rich Ge surface prevents over oxidation to $GeO_2$ and GeO is created. The hydrogen rich Ge surface may also obtain $Ge(OH)_2$ during oxidation. $Ge(OH)_2$ decomposes to GeO and H2O under thermal treatment. As a result, the process still works although with a slightly different reaction route.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for isotropically etching film on a substrate with atomic layer control, comprising:
    a) providing a substrate including a film selected from a group consisting of silicon (Si), germanium (Ge) and silicon germanium (SiGe);
    b) depositing a sacrificial layer on the film in a processing chamber by:
        cooling a lower portion of the substrate;
        one of creating or supplying an oxidant-containing plasma in the processing chamber;
        increasing a surface temperature of the substrate for a predetermined period using rapid thermal heating while creating or supplying the oxidant-containing plasma in the processing chamber;
    c) purging the processing chamber; and
    d) etching the sacrificial layer and the film by supplying an etch gas mixture and striking plasma in the processing chamber.

2. The method of claim 1, wherein the cooling the lower portion of the substrate includes maintaining a predetermined temperature of a substrate support in a range from −80° C. to 20° C. during b).

3. The method of claim 1, wherein the rapid thermal heating increases the surface temperature of the substrate to a predetermined temperature in a range from 200° C. to 1000° C.

4. The method of claim 3, wherein the predetermined period is in a range from greater than zero to less than or equal to 20 milliseconds.

5. The method of claim 1, wherein the etch gas mixture includes a gas species selected from a group consisting of fluorine (F), chlorine (Cl) and bromine (Br).

6. The method of claim 1, further comprising:
    controlling pressure in the processing chamber to a predetermined pressure in a range from less than 20 milliTorr to 10 Torr,
    wherein the oxidant-containing plasma includes at least one gas species selected from a group consisting of molecular oxygen ($O_2$), molecular hydrogen ($H_2$), molecular nitrogen ($N_2$), and helium (He).

7. The method of claim 1, further comprising:
    controlling pressure in the processing chamber to less than 1 microTorr,
    wherein the oxidant-containing plasma includes a precursor gas selected from a group consisting of silane, germane, phosphane and diborane.

8. The method of claim 1, wherein the oxidant-containing plasma is generated in the processing chamber by supplying an oxidant-containing gas mixture and supplying RF power to an inductive coil arranged around the processing chamber.

9. The method of claim 8, wherein the RF power is in a range from greater than 0 W to less than or equal to 3000 W at a predetermined frequency in a range from 2 to 14 MHz.

10. The method of claim 2, further comprising supplying RF bias power to the substrate support in a range from greater than 0 eV to 1000 eV during d).

11. The method of claim 1, further comprising repeating b), c) and d) one or more times.

12. A method for isotropically etching film on a substrate with atomic layer control, comprising:
    a) providing a substrate including an exposed layer of germanium (Ge) in a processing chamber;
    b) one of creating or supplying plasma including a hydrogen gas species in the processing chamber for a first predetermined period;
    c) after the first predetermined period, exposing the substrate to a gas mixture including an oxygen gas species for a second predetermined period to create a oxide layer on the exposed layer,
    wherein the oxide layer includes germanium monoxide (GeO) and germanium dioxide ($GeO_2$), and
    wherein the oxide layer includes more of the germanium monoxide (GeO) than the germanium dioxide ($GeO_2$); and
    d) performing rapid thermal heating of a surface of the substrate during a third predetermined period to desorb the germanium monoxide (GeO) in the oxide layer thereby etching the exposed layer of germanium (Ge).

13. The method of claim 12, wherein the substrate further includes an exposed layer of at least one of silicon (Si) and silicon dioxide (SiO2) and wherein the etching the exposed layer of germanium (Ge) is selective to the exposed layer of germanium (Ge).

14. The method of claim 12, further comprising repeating b), c) and d) one or more times.

15. The method of claim 12, wherein the plasma in b) includes a hydrogen gas species selected from a group consisting of molecular hydrogen (H2), diborane (B2H6), a hydrocarbon (CxHy) (where x and y are integers and y/x>2), ammonia (NH3), and a gas including nitrogen and hydrogen (NxHy) (where x and y are integers and y/x>2).

16. The method of claim 15, wherein the plasma in b) further includes an inert gas selected from a group consisting of molecular hydrogen (H2), molecular nitrogen (N2) and argon (Ar).

17. The method of claim 12, wherein the first predetermined period and the second predetermined period are in a range from 1 second to 120 seconds.

18. The method of claim 12, further comprising purging the processing chamber after b) and before c) and after c) and before d).

19. The method of claim 12, wherein the oxygen gas species in c) is selected from a group consisting of molecular oxygen (O2), ozone (O3), water (H2O) and nitrous oxide (N2O).

20. The method of claim 12, further comprising striking plasma during c).

21. The method of claim 12, wherein the rapid thermal heating in d) includes heating the surface of the substrate using at least one of a flash lamp and a laser.

22. The method of claim 12, wherein the third predetermined period is greater than zero and less than or equal to 1 second.

23. The method of claim 12, wherein the rapid thermal heating in d) heats the surface of the substrate during the third predetermined period to a temperature in a range from 400° C. to 800° C.

24. The method of claim 12, wherein the oxide layer includes greater than or equal to 90% germanium monoxide and less than or equal to 10% germanium dioxide.

25. The method of claim 12, further comprising converting a native germanium dioxide (GeO$_2$) layer on the exposed layer of germanium to germanium monoxide (GeO) prior to b).

* * * * *